United States Patent
Perner

(10) Patent No.: US 7,403,440 B2
(45) Date of Patent: Jul. 22, 2008

(54) ELECTRONIC MEMORY APPARATUS AND METHOD FOR OPERATING AN ELECTRONIC MEMORY APPARATUS

(75) Inventor: Martin Perner, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/444,914

(22) Filed: Jun. 1, 2006

(65) Prior Publication Data

US 2006/0280012 A1 Dec. 14, 2006

(30) Foreign Application Priority Data

Jun. 1, 2005 (DE) .................. 10 2005 025 168

(51) Int. Cl.
*G11C 7/00* (2006.01)
(52) U.S. Cl. ...................... 365/222; 365/211
(58) Field of Classification Search .............. 365/222, 365/211
See application file for complete search history.

(56) References Cited

U.S. PATENT DOCUMENTS

| 6,373,768 | B2 * | 4/2002 | Woo et al. ................. 365/211 |
| 6,778,003 | B1 * | 8/2004 | Callaway et al. ............ 327/536 |
| 7,046,579 | B2 * | 5/2006 | Suyama ..................... 365/233 |
| 2004/0218458 | A1 * | 11/2004 | Schneider et al. .......... 365/232 |
| 2005/0030806 | A1 | 2/2005 | Perner |

FOREIGN PATENT DOCUMENTS

DE       103 29 369 US       2/2005

* cited by examiner

*Primary Examiner*—Hoai V. Ho
*Assistant Examiner*—Anthan T Tran
(74) *Attorney, Agent, or Firm*—Slater & Matsil, L.L.P.

(57) ABSTRACT

An electronic memory apparatus has a plurality of memory devices, a plurality of temperature sensors and a control unit. The memory devices each have a multiplicity of nonvolatile memory cells that are refreshed during operation of the electronic memory apparatus. The control unit passes a same periodic clock signal to each of the memory devices. The clock signal causes the memory cells to be refreshed in the memory devices. Each temperature sensor is associated with a respective memory device and measures a local temperature near the respective memory device during operation. Each memory device individually determines, on the basis of the temperature measured by the temperature sensor that is assigned to it, how many of its memory cells are simultaneously refreshed when memory cells are being refreshed.

24 Claims, 10 Drawing Sheets

ELECTRONIC MEMORY APPARATUS AND METHOD FOR OPERATING AN ELECTRONIC MEMORY APPARATUS

This application claims priority to German Patent Application 10 2005 025 168.4, which was filed Jun. 1, 2005 and is incorporated herein by reference.

TECHNICAL FIELD

The invention relates to an electronic memory apparatus and to a method for operating an electronic memory apparatus.

BACKGROUND

Electronic memory apparatuses, for example memory modules or superordinate structural units having a plurality of memory modules, usually have a plurality of identical memory devices that are arranged together in the electronic memory apparatus and are driven in a parallel manner to one another. These memory devices may be, for example, memory chips that are arranged on an electronic printed circuit board of a memory module. The memory chips may be, in particular, DRAMs (Dynamic Random Access Memories) or other types of volatile semiconductor memories.

In a volatile semiconductor memory, information that is stored in the memory cells is retained only for a limited period of time of at most a few hundred ms since leakage currents result in the loss of the memory information. In order to prevent this, the volatile memory cells are refreshed at regular intervals. In this case, the memory information is read out and is written back to the memory cells in amplified form. This refresh operation is usually carried out periodically, that is to say in successive equidistant time segments. The temporal interval between successive refresh operations on one and the same memory cell corresponds to the refresh time of each individual memory cell. The refresh time must be short enough to prevent a loss of data in the memory cell. In order to refresh the memory cell, a clock signal that causes memory cells to be refreshed is provided in the memory apparatus. The periodic clock signal is provided, for example, by a control unit of the memory apparatus. The memory apparatus transmits the clock signal to each of its memory devices, likewise using the control unit, for example. The clock signal causes memory contents of the volatile memory cells to be refreshed and should be distinguished from that clock signal at a considerably higher frequency, which is generated, overall, in order to operate the memory apparatus and indicates the highest possible clock rate. In contrast, the clock signal that is dealt with here and is used for the refresh operation has a considerably larger temporal period. The period of this clock signal is dimensioned such that all of the memory cells are periodically refreshed within the intended refresh time or in a shorter temporal interval.

The period of the clock signal is generally not identical to the refresh time of an individual memory cell. This is because respective groups of memory cells are successively refreshed, that is to say at different cycle times, to be precise in cyclical order, until, after the refresh time has elapsed, the memory cells that were refreshed first are refreshed again. The temporal period of the clock signal is thus an integer factor smaller than the refresh time of the individual memory cells.

The speed at which the memory cells lose their information depends on the temperature in the memory cell's surroundings. Memory cells in locally heated regions of the memory apparatus or of the respective memory device generally lose their information more quickly than memory cells that are operated in regions of the memory apparatus that have been heated to a lesser degree or are operated even at room temperature. As a result, the temporal interval between two successive refresh operations of a memory cell (that is to say the refresh time), which still just suffices to prevent a loss of data in the memory cell, is of a different magnitude from memory cell to memory cell and is essentially influenced by the local temperature.

However, an electronic memory apparatus having a plurality of identical memory devices is always operated, for reasons of operating economy, at a standard clock rate in order to give rise to refresh operations. A periodic clock signal, which is standard for all memory devices, is thus passed to these memory devices, which internally convert it into corresponding refresh operations. All of the memory chips of a memory module, of a PDA (Personal Digital Assistant), of a mobile radio or of another mobile electronic device are thus supplied with a standard refresh signal, for example. In the case of mobile devices, in particular, a temperature-controlled self-refresh TCSR (Temperature Compensated Self-Refresh), in which a clock signal having a suitable period is internally generated for the refresh operation in all of the memory devices, for example semiconductor memory chips, is also possible. In this case, a refresh signal, which is externally provided by the memory apparatus and is to be transmitted to each memory chip is dispensed with. If a temperature sensor is fitted in each memory chip (for instance a DRAM), it itself controls, when suitably calibrated, the temperature threshold values at which the refresh rate is increased or decreased. Even if no temperature sensors are present or connected, it is possible to externally prescribe the clock rate at which such a "self-refresh" of the individual memory chips is to take place.

However, during active operation of a memory apparatus, the temperature-controlled self-refresh mechanism is not important; all of the memory devices are then operated at the required refresh rate. If a memory controller knows the temperatures prevailing at the memory chips on the basis of sensor data, a refresh rate that is adapted in a manner dependent on the temperature can be determined for the clock signal and a clock signal that pulsates at a correspondingly faster or slower rate can be generated and passed to all of the memory chips. If the actual local temperature of the memory chips does not match the temperature detected by the control unit (or the memory controller), which is common, there is a risk of data being lost or a large amount of current is unnecessarily used for the refresh operation.

The above-mentioned control thus has the disadvantage that a standard periodic clock signal must always be provided for the refresh operation for all of the memory devices. Although the clock rate of this standard clock signal can be changed in a manner dependent on the temperature, it is still standard for all memory devices when restricted to a particular clock rate and thus does not take into account temperature fluctuations between the memory devices. Some memory devices that are cooler than others are thus refreshed at an unnecessarily high clock rate, for example, which leads to excessive power consumption. However, power-saving operation would be desirable especially in mobile devices. It is also disadvantageous that the clock rate of the standard clock signal for refreshing the memory device must be changed from the outside if faster or slower refreshing of the memory cells is desired. Operation with a temperature-independent period duration of a standard clock signal is thus conventionally impossible if the refresh times of the memory cells are intended to be capable of being varied in a manner dependent on the temperature.

SUMMARY OF THE INVENTION

In one aspect, the present invention provides a memory apparatus that makes it possible to shorten or extend the refresh time of the memory cells in a manner dependent on the temperature given a temperature-independent constant period of a standard clock signal for refreshing the memory cells. In particular, the refresh time in each memory device is intended to be capable of being changed on the basis of the local temperature of the respective memory device without having to change the period of the standard clock signal for the refresh operation for this purpose.

In a first embodiment, an electronic memory apparatus has a plurality of memory devices, a plurality of temperature sensors and a control unit. The memory devices each have a number of nonvolatile memory cells that are refreshed during operation of the electronic memory apparatus. The control unit passes a standard periodic clock signal to each of the memory devices. The clock signal causes memory cells to be refreshed in the memory devices. Each temperature sensor is assigned to a memory device and measures a local temperature in the vicinity of the respective memory device during operation. Each memory device determining, on the basis of the temperature measured by the temperature sensor that is assigned to it, how many of its memory cells are simultaneously refreshed during a refresh operation when memory cells are being refreshed.

According to embodiments of the invention, provision is made for each memory device itself to individually determine, on the basis of a measured temperature and independently of the other memory devices, how many memory cells are refreshed upon each pulse of the clock signal, which is standard for all memory devices. Instead of changing the clock rate or the period of the standard clock signal itself (as is customary) and thus simultaneously influencing the refresh time in all of the memory devices, an individual refresh time for each memory device is achieved according to embodiments of the invention by changing the number of memory cells that can be simultaneously refreshed. Since memory cells are refreshed in cyclical order, usually in the order of the word lines to which they are connected, the number of memory cells that can be simultaneously refreshed during a pulse of the clock signal can be changed, for example, by increasing or decreasing the number of word lines that can be simultaneously addressed in a parallel manner. Doubling the number of word lines that are simultaneously addressed and activated and thus give rise to the connected memory cells being refreshed halves the refresh time of the memory cells of the respective memory device, for example. This achieves higher operational reliability in a memory device that has been heated to a relatively great extent.

Provision is preferably made for the memory devices to carry out a refresh operation upon each pulse of the periodic clock signal, the number of memory cells that are refreshed during a pulse of the periodic refresh signal being changed on the basis of the local temperature. In this case, a refresh operation is carried out at each cycle time of the periodic clock signal even when, for instance, fewer memory cells than is normally customary are intended to be simultaneously refreshed. By way of example, only a smaller number of memory cells are refreshed during each refresh operation instead of dispensing with a refresh operation, for instance only in each second pulse. As a result, each pulse of the refresh signal can be used to give rise to a refresh operation; it is thus not necessary to change the period of the standard clock signal.

Provision is preferably made for the memory devices to increase the number of memory cells, which can be simultaneously refreshed, by a factor of $2^n$ in the case of an increased local temperature, n being a natural number. Provision may likewise be made for the number of memory cells, which can be simultaneously refreshed, to be decreased by such a factor of $2^n$ in the case of a temperature that is locally measured at a memory device and is less than an intended average temperature.

Provision is preferably made for the memory devices to be volatile memory chips that each have a plurality of memory banks in which the memory cells are connected to word lines, memory cells other than those in the respective preceding pulse of the clock signal being refreshed upon each pulse of the periodic clock signal. The memory devices may, in particular, have semiconductor memory circuits in which the integrated memory cells are respectively connected to word lines and bit lines. The memory banks are identical memory cell arrays that each has their own word lines and bit lines.

Provision is preferably made for the memory devices to each have a plurality of memory banks and for the periodic clock signal to always be simultaneously forwarded to all of the memory banks. In this embodiment, the periodic clock signal is internally forwarded to all of the memory banks of the respective memory device at each cycle time irrespective of whether or not the number of memory cells that can be simultaneously refreshed in an overall memory device has been increased or decreased. The standard clock signal is thus always available in each memory bank in order to control the refreshing of memory cells.

When the temperature that is measured by a temperature sensor that is assigned to a memory device is within a prescribed bandwidth for the operating temperature, provision is preferably made for a respective first number of memory cells to be simultaneously refreshed in all of the memory banks of the respective memory device upon each pulse of the clock signal. When the temperature sensor that is assigned to a memory device measures an expected operating temperature, a particular prescribed number of memory cells are thus refreshed per pulse of the clock signal. One word line per memory bank may be respectively addressed per pulse of the clock signal, as a result of which the memory cells that are connected to the word line are refreshed.

When the temperature that is measured by a temperature sensor that is assigned to a memory device is above an upper limiting value for the operating temperature, provision is preferably made for a respective second number of memory cells to be simultaneously refreshed in all of the memory banks of the respective memory device upon each pulse of the clock signal, the second number being greater than the first number. In the case of a locally increased temperature in the vicinity of one or more memory devices, a greater number of memory cells than is customary at the expected operating temperature are therefore simultaneously refreshed in the memory devices upon each pulse of the clock signal.

When the temperature that is measured by a temperature sensor that is assigned to a memory device is below a lower limiting value for the operating temperature, provision is also made for a third number of memory cells to be simultaneously refreshed upon each pulse of the clock signal, the third number being less than the first number and, upon each pulse, the quantity of memory cells to be refreshed being selected, in a manner encompassing the memory banks, from one or more memory banks of the plurality of memory banks. In the case of relatively low temperatures of individual memory devices, the number of memory cells that are simultaneously refreshed in the devices is therefore reduced. The measures described above change the refresh time of each individual memory cell depending on the temperature of the memory device in question without having to change the period of the standard periodic clock signal for this purpose. The refresh time of the memory cells is also individually optimized for each memory device.

Provision is preferably made for the memory devices to use the periodic clock signal to count and address word lines, the memory cells that are connected to respective addressed word lines being refreshed and word lines other than those in the respective preceding pulse of the clock signal being addressed upon each pulse of the clock signal.

When the temperature that is measured by a temperature sensor that is assigned to a memory device is within a prescribed bandwidth for the operating temperature, provision is preferably made for precisely one word line to be respectively addressed in a parallel manner in all of the memory banks upon each pulse of the clock signal, the word lines of the respective memory bank, which are to be addressed, respectively being counted, beginning from a first word line to a last word line of the respective memory bank and, after the last word line of the respective memory bank has been addressed, the first word line of the respective memory bank being addressed again upon the next pulse of the clock signal.

While the local temperature of a memory device in question is within a prescribed desired value range, the memory cells in a memory bank are thus refreshed in cyclical order of the word lines to which they are connected, one word line respectively being addressed per cycle time in order to refresh the memory cells that are connected to the word line. This means that, after running through all of the word lines of a memory bank from the first word line to the last word line of the memory bank in question, the first word line is addressed again in the subsequent pulse of the clock signal, the second word line is then addressed again in the pulse after next, etc.

When the temperature that is measured by a temperature sensor that is assigned to a memory device is above an upper limiting value for the operating temperature, provision is preferably made for $2^n$ word lines to be respectively addressed in all of the memory banks upon each pulse of the clock signal, n being a natural number and the word lines respectively being counted, beginning from a first word line to a last word line, in sub-units of the memory banks and, after the last word line of the respective sub-unit of the memory bank has been addressed, the first word line of the respective subunit of the respective memory bank being addressed again upon the next pulse of the clock signal. 2, 4, 8, 16 or even more word lines per cycle time are therefore addressed upon each pulse of the clock signal in order to increase the parallelism of the simultaneous refreshing of memory cells.

When the temperature that is measured by a temperature sensor that is assigned to a memory device is below a lower limiting value for the operating temperature, provision may likewise be made for less than one word line per memory bank to be addressed, on average, upon each pulse of the clock signal, the word lines being counted in a manner encompassing the memory banks and, after a last word line of a memory bank has been addressed, a first word line of another memory bank of the same memory device being addressed in the next pulse of the clock signal. According to embodiments of the invention, when less than one word line per memory bank is intended to be addressed per pulse of the clock signal, the word lines are therefore counted in a manner encompassing the memory banks and are addressed and activated in cyclical order. In this case, however, the addressing cycles extend over more than one memory bank and therefore make it possible to activate, averaged over all of the memory banks, less than one word line per memory bank and per pulse of the clock signal, on average.

Provision is preferably made for the memory banks to respectively have a plurality of memory segments, a group of word lines, to which the memory cells of the respective memory segment are connected, being arranged in each memory segment. Provision is also preferably made for the sub-units of the memory banks, to which the addressing cycles for activating the word line are restricted in order to achieve a higher degree of parallelism in the case of increased temperatures, to be respective memory segments or to comprise a plurality of memory segments. Each memory segment is a region of a memory bank whose size results from the length of the bit lines and the length of the word lines. The number of memory cells per bit line and the number of memory cells per word line result, when multiplied together, in the number of memory cells per memory segment. The largest possible number (according to embodiments of the invention) of memory cells that are simultaneously refreshed per pulse of the clock signal results when one word line is respectively addressed and activated per memory segment and per cycle time.

In an alternative embodiment, provision is made for the word lines to be segmented word lines that each have a plurality of word line segments, and for the sub-units of the memory banks to respectively comprise those memory cells that are connected to precisely one respective word line segment of all of the word lines of the respective memory bank. Therefore, the number of memory cells that can be simultaneously refreshed can be decreased by activating merely word line segments rather than complete word lines, for instance, upon each pulse of the clock signal.

Provision is preferably made for a first operating mode or a second operating mode of the memory apparatus to be able to be selectively set, the number of memory cells that are simultaneously refreshed per pulse of the clock signal being temperature-dependent in the first operating mode and the number of memory cells that are simultaneously refreshed per pulse of the clock signal depending, in the second operating mode, on the temperature measured by the temperature sensor that is assigned to the respective memory device. The choice of the respective operating mode may be able to be set using special codes (Extended Mode Register Set). In the second operating mode, the memory apparatus is operated in an automatic power-saving mode that, depending on the local operating temperature, automatically individually adapts possible extensions of the refresh time or reductions in the refresh time, which are necessary on account of the temperature, in the memory devices in question.

Provision is preferably made for the memory apparatus to be a memory module. The memory devices are preferably memory chips, for example DRAMs, which are arranged on the memory module.

Provision is alternatively made for the memory apparatus to have a plurality of memory modules that are connected, for example, to a common main board. In this case, the memory modules themselves form the memory devices. In this case, provision is preferably made for each memory module to have a plurality of volatile memory chips in which the memory cells are connected to word lines, memory cells other than those in the respective preceding pulse of the clock signal being refreshed upon each pulse of the clock signal. Each memory module preferably respectively forwards the clock signal to all of its memory chips, to be precise upon each pulse of the clock signal.

Provision is preferably made for the memory modules to use the periodic clock signal to count and address the word lines of the memory chips of the respective memory module, the memory cells that are connected to addressed word lines respectively being refreshed and word lines other than those in the respective preceding pulse of the clock signal being addressed upon each pulse of the clock signal.

When the temperature that is measured by a temperature sensor that is assigned to a respective memory module is within a prescribed bandwidth for the operating temperature, provision is preferably made for precisely one word line to be respectively addressed in all of the memory chips of the respective memory module upon each pulse of the clock signal, the word lines of the respective memory chips being counted, beginning from a first word line to a last word line of the respective memory chip and, after the last word line of the respective memory chip has been addressed, the first word line of the respective memory chip being addressed again upon the next pulse of the clock signal. In this embodiment, the word lines of each memory chip are addressed and activated in cyclical order, word lines other than those in the preceding pulse of the clock signal being addressed and activated upon each pulse of the clock signal. The cycles of word lines that are successively addressed may also extend merely over partial regions of the memory chips, for example only over individual memory banks of the memory chips. In this embodiment, the important factor is that the cycles of word lines, which are successively driven and are successively counted with the aid of the pulses of the clock signal, are all arranged in the same respective chip.

When the temperature that is measured by a temperature sensor that is assigned to a respective memory module is above an upper limiting value for the operating temperature, provision is preferably made for $2^n$ word lines to be respectively addressed in each memory chip of the respective memory module upon each pulse of the clock signal, n being a natural number and the word lines respectively being counted, beginning from a first word line to a last word line, in partial regions of the memory chips and, after the last word line of the respective partial region of the memory chip has been addressed, the first word line of the respective partial region of the memory chip being addressed again upon the next pulse of the clock signal. In this case, the word lines are addressed and counted in such a manner that the cycles of word lines that are successively addressed respectively cover only one partial region of a memory chip or, if each activation sequence of word lines covers only one partial region of a memory chip anyway even at a normal operating temperature, such partial regions are selected to be even smaller at higher temperatures in order to increase the refresh time of the memory cells even further.

When the temperature that is measured by a temperature sensor that is assigned to a respective memory module is below a lower limiting value for the operating temperature, provision is preferably made for less than one word line per memory chip to be addressed, on average, upon each pulse of the clock signal, the word lines being counted in a manner encompassing the memory chips and, after a last word line of a memory chip has been addressed, a first word line of another memory chip of the respective memory module being addressed upon the next pulse of the clock signal. Therefore, at relatively low temperatures, word lines of a plurality of memory chips at which the reduced temperature was measured are counted in a manner encompassing the memory chips. This makes it possible to reduce the number of simultaneously addressed word lines and thus the number of simultaneously refreshed memory cells to less than one single word line per cycle time and per memory chip (and to a correspondingly smaller number of memory cells that are respectively refreshed).

Embodiments of the invention also provide a method for operating an electronic memory apparatus that has a plurality of memory devices and a plurality of temperature sensors, each of which is respectively assigned to a memory device and measures a temperature in the vicinity of the respective memory device. A control device passes a standard periodic clock signal to each of the memory devices. The memory apparatus is controlled in such a manner that each memory device individually determines, on the basis of a temperature measured by the assigned temperature sensor, the temporal period with which each individual memory cell of the respective memory device is refreshed.

According to embodiments of the invention, depending on the measurement result of the assigned temperature sensor, the number of memory cells that can be simultaneously refreshed per refresh cycle time is changed in each memory device of the electronic memory apparatus, to be precise individually for each memory device and independently of the respective other memory devices. This makes it possible for the refresh times of the memory cells to be adapted, in a differentiated manner, to the local operating temperature of the respective memory device in which the memory cells are arranged.

Provision is preferably made for the number of memory cells that are simultaneously refreshed during a pulse of the periodic clock signal to be changed for each memory device on the basis of a temperature measured by the temperature sensor that is assigned to the memory device.

Provision is preferably made for the memory devices to refresh memory cells other than those in the preceding pulse of the clock signal upon each pulse of the clock signal, the memory apparatus being controlled in such a manner that the number of memory cells that are simultaneously refreshed per pulse of the clock signal is increased or decreased by a factor of $2^n$ in each memory device on the basis of a local temperature, n being a natural number that depends on the respective temperature measured.

Provision is preferably made for the memory apparatus to be controlled in such a manner that the control unit passes a standard periodic clock signal whose temporal period is independent of the temperature to all of the memory devices.

BRIEF DESCRIPTION OF THE DRAWINGS

The invention will be described below with reference to the Figures, in which.

The following list of reference symbols can be used in conjunction with the figures:

| | |
|---|---|
| 1; 20 | Electronic memory apparatus |
| 2; 20 | Memory module |
| 5 | Control unit |
| 8 | Temperature sensor |
| 10 | Memory device |
| 11; 22; 22a, . . ., 22d | Integrated memory chip |
| 12; 12a, . . ., 12d | Memory bank |
| 13 | Sub-unit |
| 14 | Memory segment |
| 19 | Word line |
| 19a | First word line |
| 19z | Last word line |
| 21, 31 | Word line segment |
| 23 | Partial region |
| 25 | Main board |
| 100 | Memory cell |
| A | First operating mode |
| B | Second operating mode |
| B1, B2, B3 | Bandwidth for the operating temperature |
| G2 | Upper limiting value |
| G3 | Lower limiting value |
| P | Period |
| S | Clock signal |
| t | Pulse of the clock signal |
| T; T1, T2, T3 | Temperature |
| z1 | First number |
| z2 | Second number |
| z3 | Third number |

DETAILED DESCRIPTION OF ILLUSTRATIVE EMBODIMENTS

Figure 1:
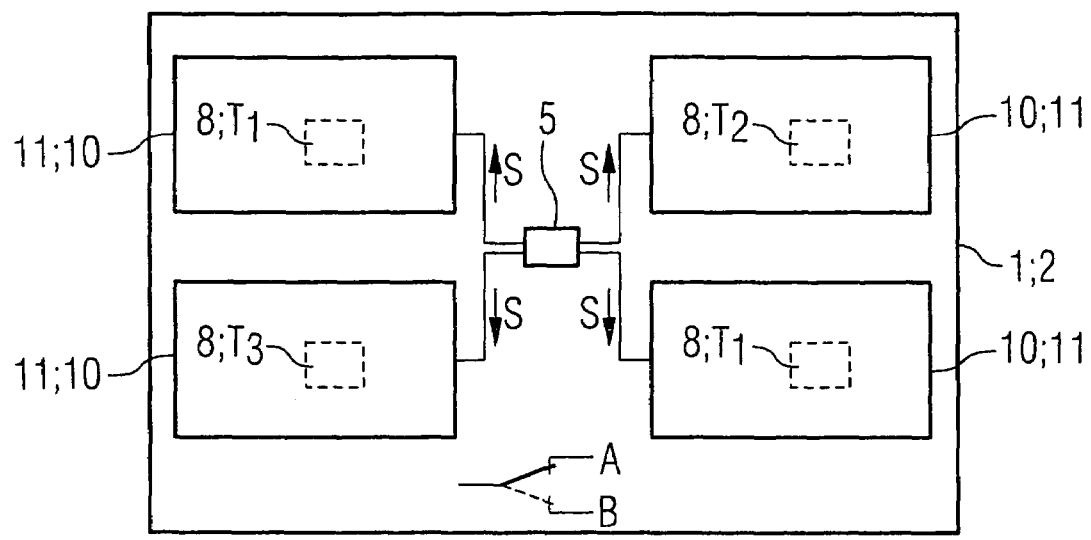
FIG. 1 shows a diagrammatic plan view of an inventive electronic memory apparatus having a plurality of memory devices.

FIG. 1 shows a diagrammatic plan view of an inventive electronic memory apparatus 1, which has a plurality of memory devices 10. The memory apparatus 1 may be, for example, a memory module 2 and the memory devices may be, for example, integrated memory chips 11, for instance DRAMs, which are packaged in a housing or are unhoused. The memory apparatus may also be a mobile device, for example a mobile radio (mobile phone). The memory apparatus 1 has a plurality of temperature sensors 8, each of which is respectively assigned to a memory device 10. In FIG. 1, the temperature sensors 8 are bordered by dashed lines and may be arranged, for example, between the respective memory device 10, to which they are assigned, and a main board of the memory apparatus 1. The memory apparatus 1 also has a control unit 5, which passes a standard periodic clock signal S to all of the memory devices 10. Corresponding connecting lines for this purpose are diagrammatically illustrated. The inventive memory apparatus may be selectively operated in a first operating mode A or in a second operating mode B, as is diagrammatically illustrated in FIG. 1 using a switch. In the first operating mode A, the clock rate of the standard periodic clock signal S and the refresh time, that is to say the temporal interval after which any desired memory cell is refreshed again, are respectively independent of the temperature and, in particular, independent of the temperatures T1, T2, T3, which are locally measured with the aid of the temperature sensors 8 in the vicinity of, or at, the memory units 10.

Figure 2:
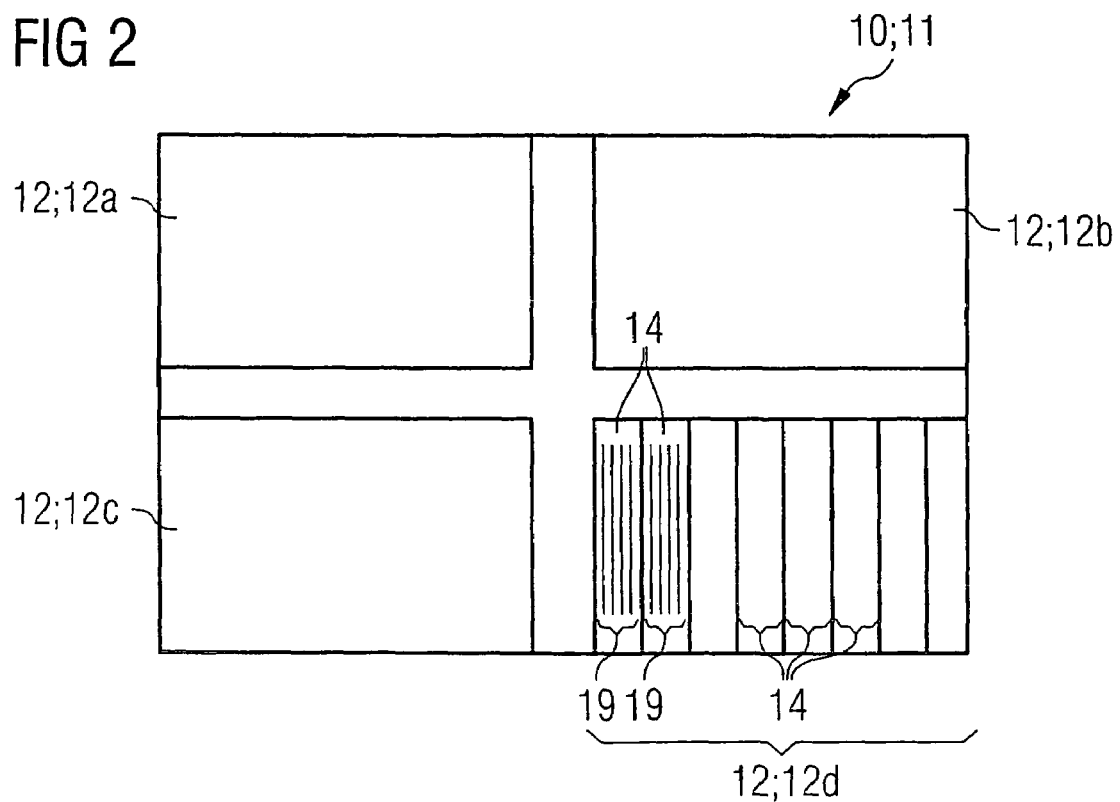
FIG. 2 shows a diagrammatic plan view of one of the four memory devices illustrated in FIG. 1.

FIG. 2 shows a diagrammatic plan view of one of the memory devices 10 of the memory apparatus 1 from FIG. 1. The memory device 10 is, in particular, an integrated memory chip 11, which has a volatile memory circuit, for instance that of a DRAM. The diagrammatically illustrated memory chip 11 has a plurality of memory banks 12; 12a, . . . , 12d. The memory banks 12 are in turn subdivided into memory segments 14, as is illustrated using the memory bank 12d illustrated at the bottom right in FIG. 2. Word lines 19 to which a multiplicity of memory cells are respectively connected run in each memory segment 14.

Figure 3:
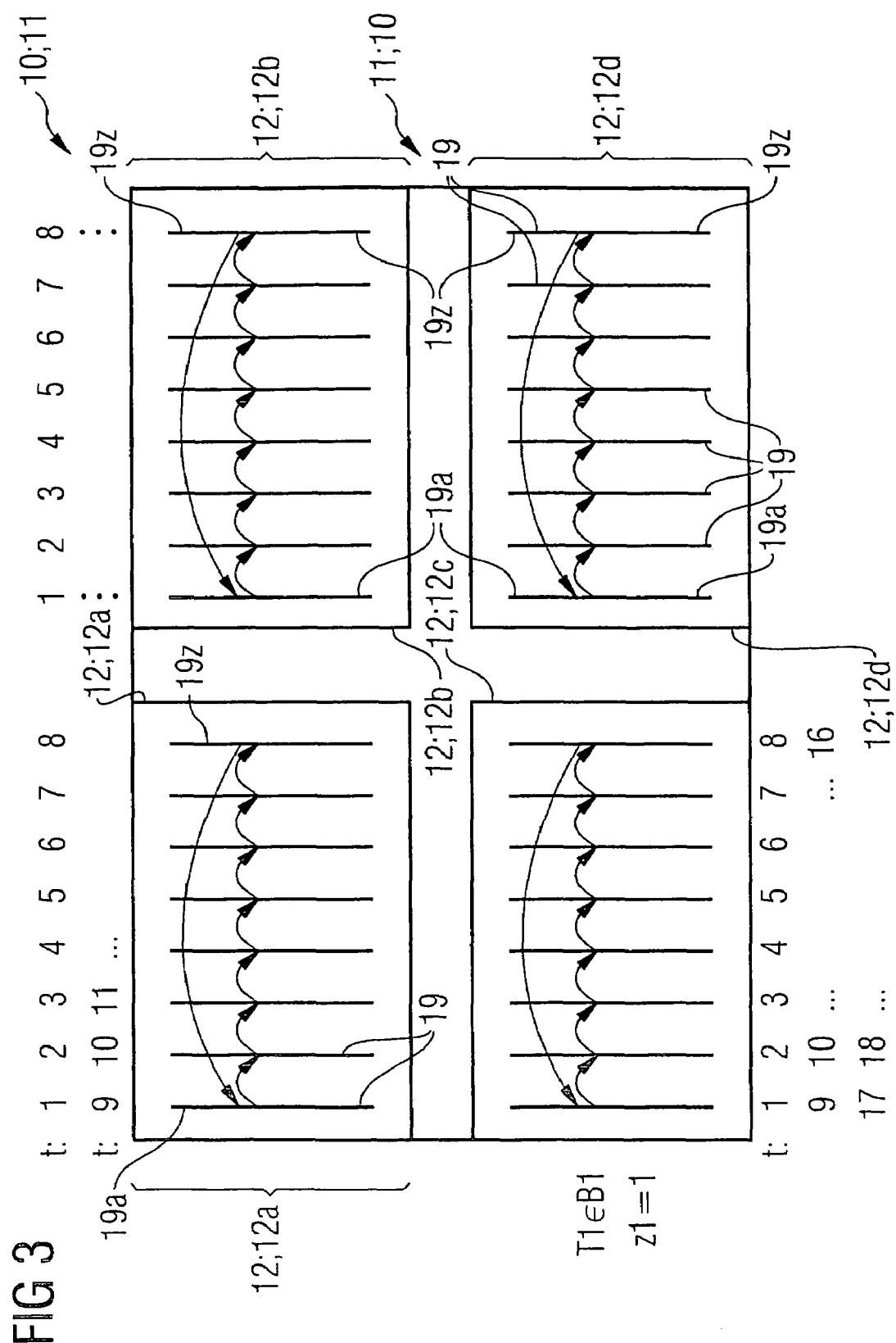
FIG. 3 shows a diagrammatic illustration of the temporal sequence when refreshing memory cells, which are connected to word lines, in the case of an average temperature of a memory device.

FIG. 3 diagrammatically shows the order in which the word lines 19, which are arranged in the memory banks 12; 12a, . . . , 12d of the memory device 10, are counted, addressed and activated in temporal succession, caused by a respective pulse t of the periodic clock signal S. In this case, the memory cells that are connected to addressed and activated word lines are respectively refreshed. FIG. 3 diagrammatically illustrates eight respective word lines 19 per memory bank 12, the word lines respectively representing all of the word lines 19 of the respective memory bank 12. The curved arrows that are illustrated in FIG. 3 and respectively point from one word line 19 to the next word line, which is generally adjacent, represent the temporal order in which the word lines are successively activated in order to refresh the connected memory cells. FIG. 3 illustrates the activation cycle and thus the refresh cycle for the case in which the temperature T1 of the memory device 10 is within a prescribed range B1 for the operating temperature. In this case, a first number z1=1 of word lines (namely precisely one single word line) are simultaneously activated per pulse t of the clock signal and per memory bank 12.

By way of example, a first word line 19a of the memory bank 12a is thus activated in the memory bank 12a during a pulse having the number 1 and the adjacent second word line of the memory bank 12a is then activated in pulse 2, etc. until a last word line 19z of the memory bank 12a is activated in pulse 8. The memory cells that are connected to the respective activated word line are respectively refreshed at the relevant cycle time t. At the subsequent cycle time 9, the first word line 19a is addressed again, with the result that the memory cells that are connected to the word line are refreshed with a refresh time whose period P is eight times as large as the duration of one pulse t of the clock signal S (FIG. 1).

At the same time as a word line of the memory bank 12a is activated, the corresponding word lines of the other memory banks 12b, 12c, 12d are activated, the activation order in the other memory banks being exactly the same as in the memory bank 12a.

Figure 4:
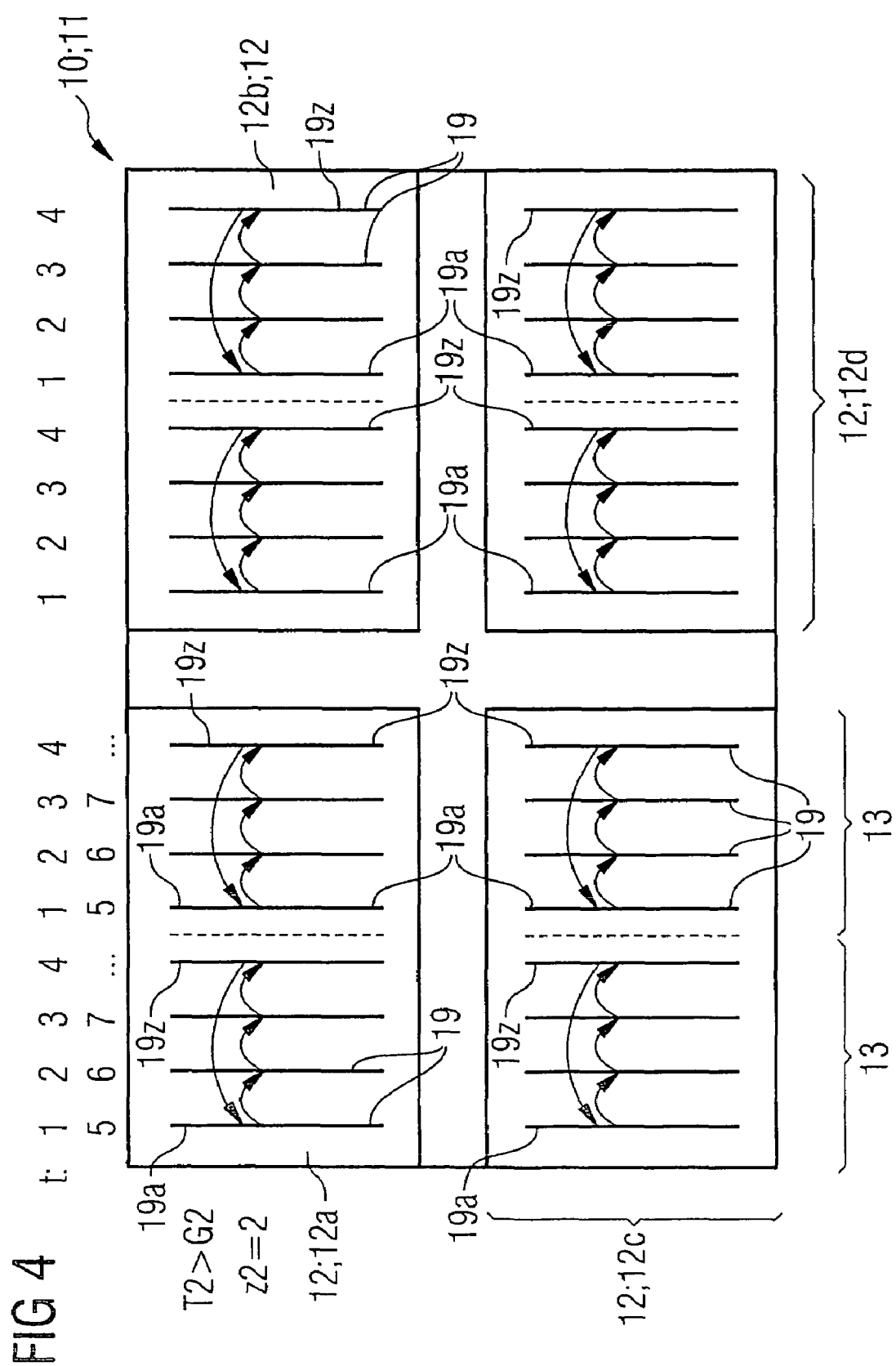
FIG. 4 shows a diagrammatic illustration of the temporal sequence of refreshing the memory cells in the case of an increased temperature of a memory device.

FIG. 4 diagrammatically shows the activation order of word lines for the case in which the temperature T2 of the memory device 10 is greater than an upper limiting value G2 for the operating temperature of the memory device 10. The limiting value G2 specifies the highest temperature at which it is still not necessary to change the number of memory cells that can be simultaneously refreshed per cycle time in the memory device 10. However, since the temperature T2 is greater than the upper limiting value G2, the number of memory cells that can be simultaneously refreshed per pulse of the standard periodic signal is increased according to embodiments of the invention in the memory device 10, to be precise, to a second number z2=2. To this end, reduced addressing cycles that respectively extend only over sub-units 13 of the memory banks 12 of the memory device 10 are used during operation of the memory device. The sub-units 13 may each comprise one or more memory segments 14 (FIG. 2). As shown in FIG. 1, a first word line 19a of a first sub-unit 13 (which is illustrated on the left in FIG. 4) of each memory bank 12 is addressed and activated in pulse 1. As early as the cycle time 4, the respective last word line 19z of each sub-unit 13 of the memory banks 12 is addressed, with the result that the first word line 19a is activated again in pulse 5. In this cycle, twice as many word lines per memory bank 12, and thus also in the entire memory chip 11, as in FIG. 3 are activated per pulse. This halves the refresh time of the memory cells. In the case of an even higher temperature, sub-units 13 whose size has been reduced even further in comparison with FIG. 4 may be used, as a result of which the number of simultaneously activated word lines is increased by a factor of 4, 8, 16, etc., overall.

Figure 5:
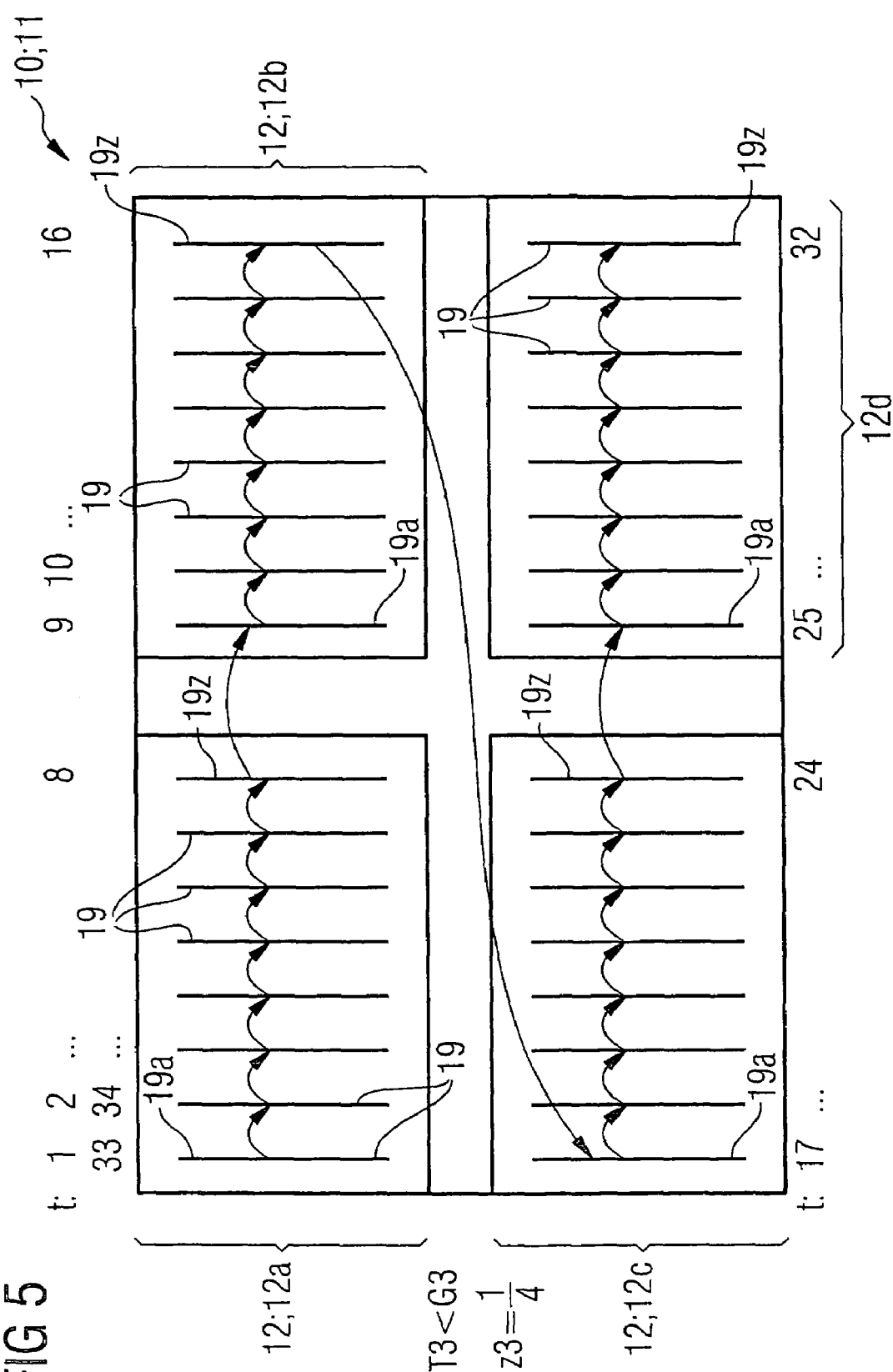
FIG. 5 shows a diagrammatic illustration of the temporal sequence of refreshing the memory cells in the case of a reduced temperature of a memory device.

FIG. 5 diagrammatically shows the addressing cycle for a memory device 10 for which the temperature sensor assigned to the latter measures a temperature T3, which is less than a lower limiting value G3 for the operating temperature. At this temperature, the word lines 19 are counted and addressed in the counting order in a manner encompassing the memory banks, but only within this individual memory device 10. After the word lines 19 of the first memory bank 12a have been successively activated during pulses 1 to 8 without further word lines 19 simultaneously having been activated in the other memory banks 12b, 12c, 12d, a first word line 19a of a further memory bank 12b is addressed in pulse 9. The further word lines 19 of the further memory bank 12b are then addressed until the last word line 19z of the second memory bank 12b. In the subsequent pulse (pulse 17), a first word line 19a of yet another memory bank 12c is activated. In this way, the word lines 19 are successively activated, in a manner encompassing all four memory banks 12, until the last word line 19z of the fourth memory bank 12d (which is illustrated at the bottom right in FIG. 5) is activated in pulse 32. The first word line 19a of the first memory bank 12a is then activated again in pulse 33. The period of this activation cycle is 32 cycle times, eight word lines which represent all of the word lines of the memory bank in question again being illustrated per memory bank. In comparison with normal operation at the intended operating temperature illustrated in FIG. 3, it emerges that a third number of, on average, z3=0.25 word lines are respectively activated per pulse and per memory bank 12. The refresh time of each individual memory cell is thus increased by a factor of 4, the memory device 10 receiving the same periodic clock signal S (FIG. 1) always with a standard temperature-independent period duration, as in FIGS. 3 and 4.

The inventive change in the access to, and the counting of, the word lines at differing temperatures makes it possible to change the refresh time of the memory cells in each memory chip 11 of a memory module or of another electronic device without having to vary the period of the periodic clock signal, which is jointly transmitted to all memory cells, in a manner dependent on the temperature.

Figure 6:
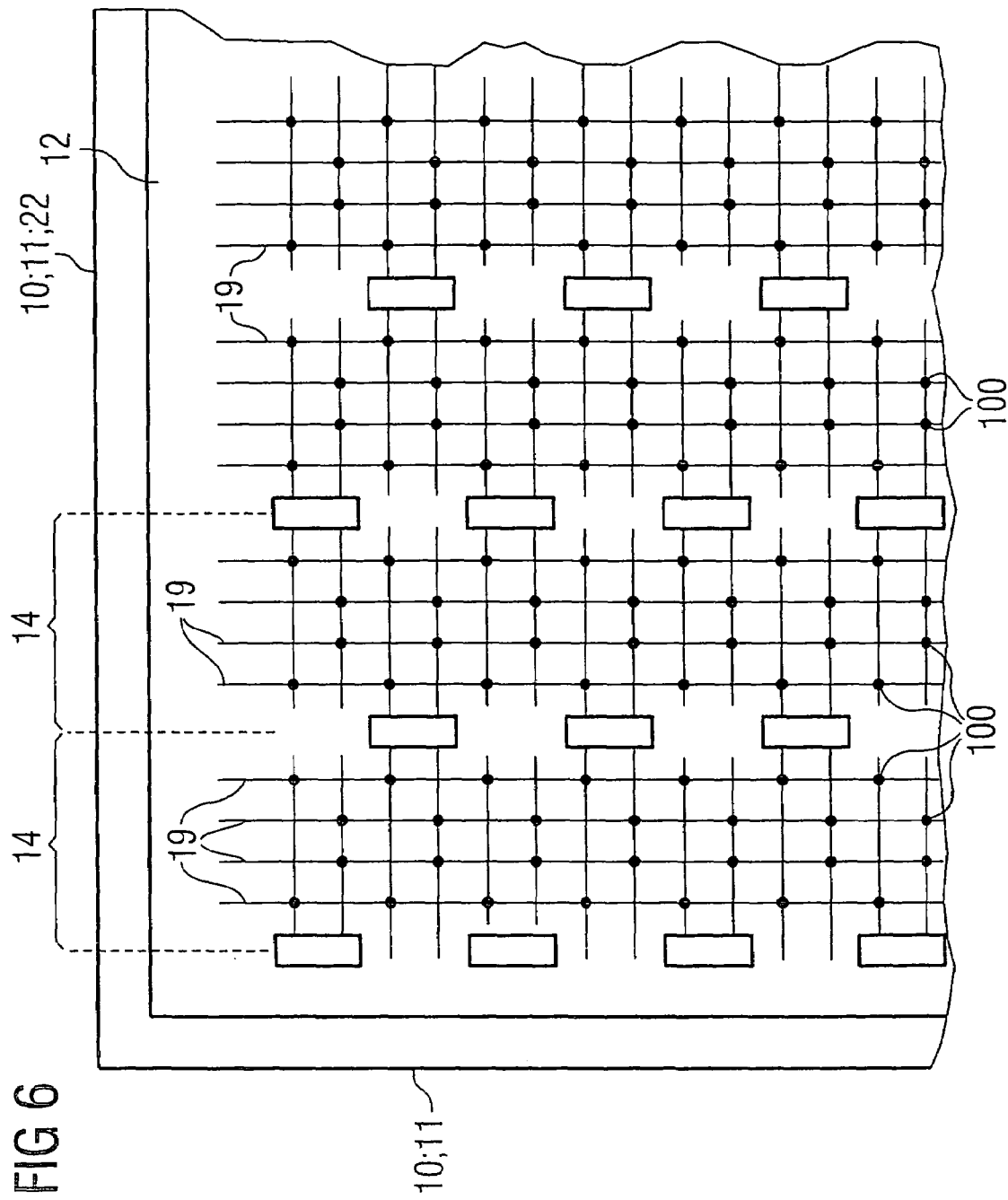
FIG. 6 shows an enlarged detail view of a memory block of a memory device as shown in FIG. 2.

FIG. 6 shows a diagrammatic plan view of a section of the memory device shown in FIGS. 2 to 5, a corner region of a memory bank 12 being illustrated. As already described with reference to FIG. 2, the memory bank 12 is composed of a plurality of memory segments 14 in which groups of word lines 19 respectively run. The memory cells 100, which are connected to the word lines, are also connected to bit lines that run in the horizontal direction in FIG. 6 and are in turn connected to signal amplifiers (sense amplifiers) and differential amplifiers that are illustrated in the form of rectangles in FIG. 6. The number of bit lines and word lines 19 that run in each memory segment 14 reveal the total number of memory cells per memory segment down to a factor of 2. If, when refreshing memory cells, all of the word lines 19 are counted in the rhythm of the cycle times of the clock signal S (FIG. 1), one word line 19 at least per memory bank 12 is respectively activated. The memory cells 100 that have been refreshed lose part of their charge, during the pulses of the clock signal that follow their activation, until they receive, after the refresh time, the signal that has been read out and written back in amplified form. The memory cells that are illustrated merely in the form of dots in FIG. 6 are preferably memory cells of a DRAM that have a selection transistor and an integrated storage capacitor, for example a trench capacitor or stacked capacitor.

Figure 7:
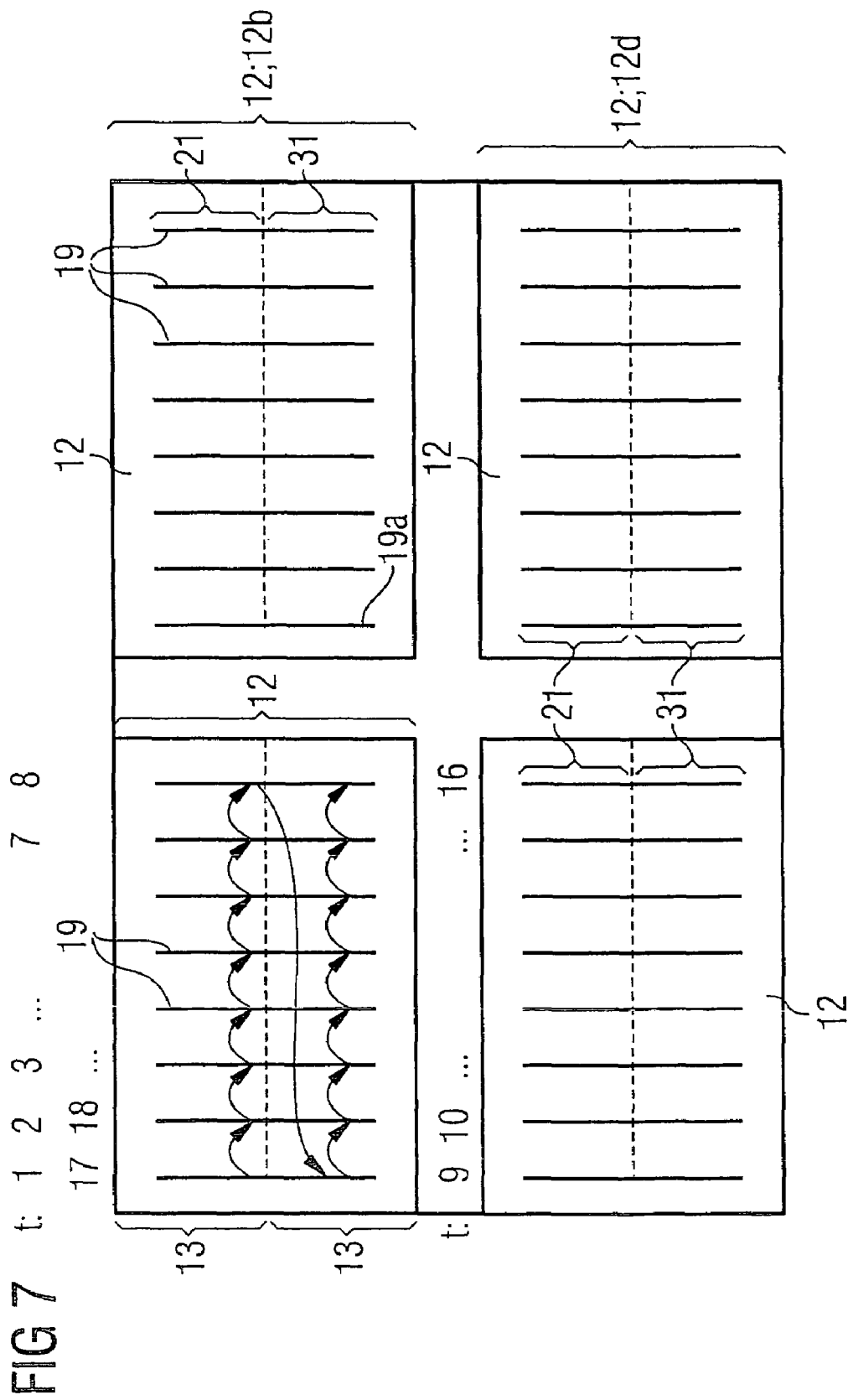
FIG. 7 shows a diagrammatic illustration of the temporal sequence of refreshing memory cells according to an alternative embodiment of the invention.

FIG. 7 shows a diagrammatic illustration of an addressing pattern of a memory device 10 from FIG. 2 according to an alternative embodiment. In this embodiment, the memory banks 12 are subdivided into sub-units 13, which respectively extend over all of the word lines 19 of the memory bank 12 in question but occupy only part of the word line length of the word lines 19. In particular, each partial region 13 respectively extends only over one or more memory segments 21, 31 of the word lines 19. FIG. 7 illustrates an example in which each word line has two word line segments 21, 31 and each sub-unit 13 exclusively addresses memory cells of a single word line segment 21, 31 of the word lines 19 of the memory bank 12 in question. FIG. 7 again illustrates eight word lines 19 per memory bank 12. According to the arrows that are illustrated only for the memory bank illustrated at the top left in FIG. 7, word line segments 21, 31 of individual word lines are successively activated until both word line segments 21, 31 of all of the word lines 19 have been activated and the memory cells connected to the word lines have been refreshed after pulses 1 to 16 of the clock signal S (FIG. 1). The word line segments in the other memory banks 12 of FIG. 7 are counted in exactly the same manner as in the memory bank illustrated at the top left in FIG. 7.

Figure 8:
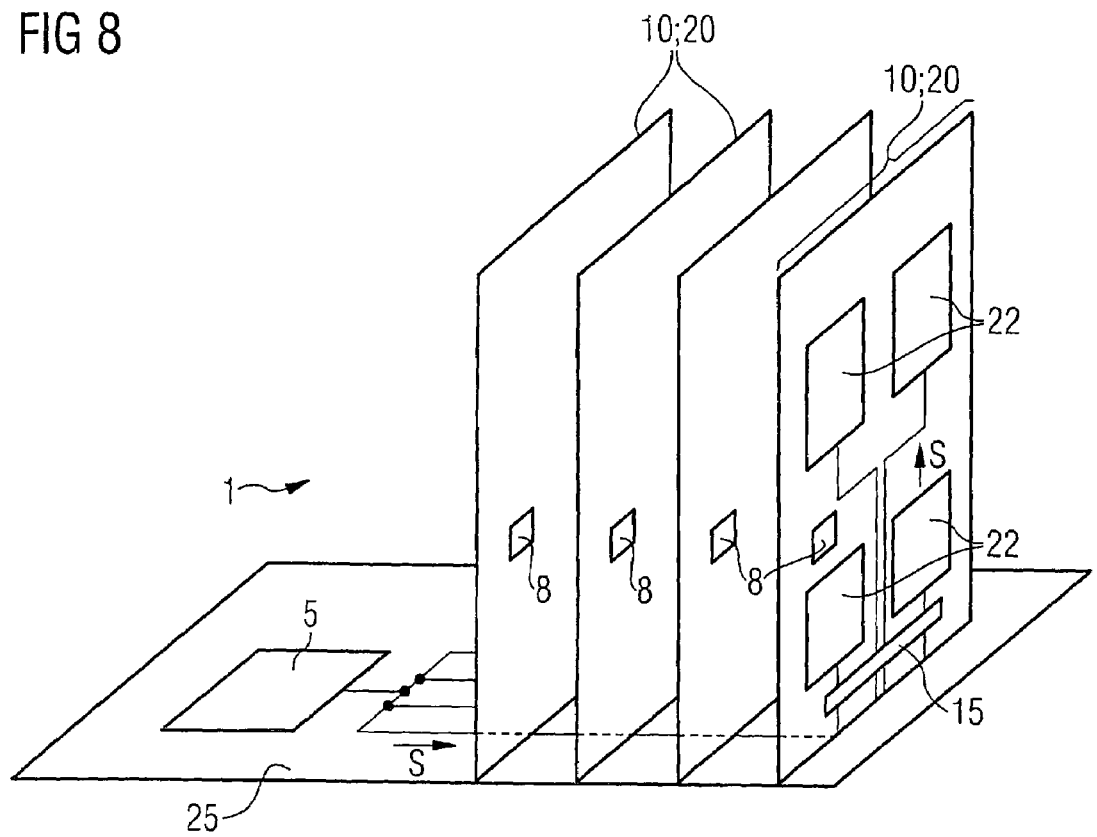
FIG. 8 shows an alternative embodiment of an inventive memory apparatus.

FIG. 8 shows an alternative embodiment of the inventive memory apparatus which has a plurality of memory modules 20. Each of the memory modules 20 forms a memory device 10 and has a plurality of integrated memory chips 22 that are connected, for example, to a printed circuit board of the respective memory module 20. The memory modules 20 are connected to a main board 25 on which the control unit 5 is also arranged, the control unit passing the periodic clock signal S to all of the memory chips 22 on all of the memory modules 20 via branched lines. In the embodiment shown in FIG. 8, a separate temperature sensor 8, which measures the temperature of the respective memory module 20, is provided on each memory module 20. The memory module 20 in question changes the number of memory cells that are simultaneously refreshed per cycle time of the clock signal S, if appropriate when the locally measured temperature deviates from a desired value (or from a desired value range). As a result, each memory module 20 individually achieves a refresh time that is matched to its temperature without having to change the period of the standard clock signal S.

Figure 9:
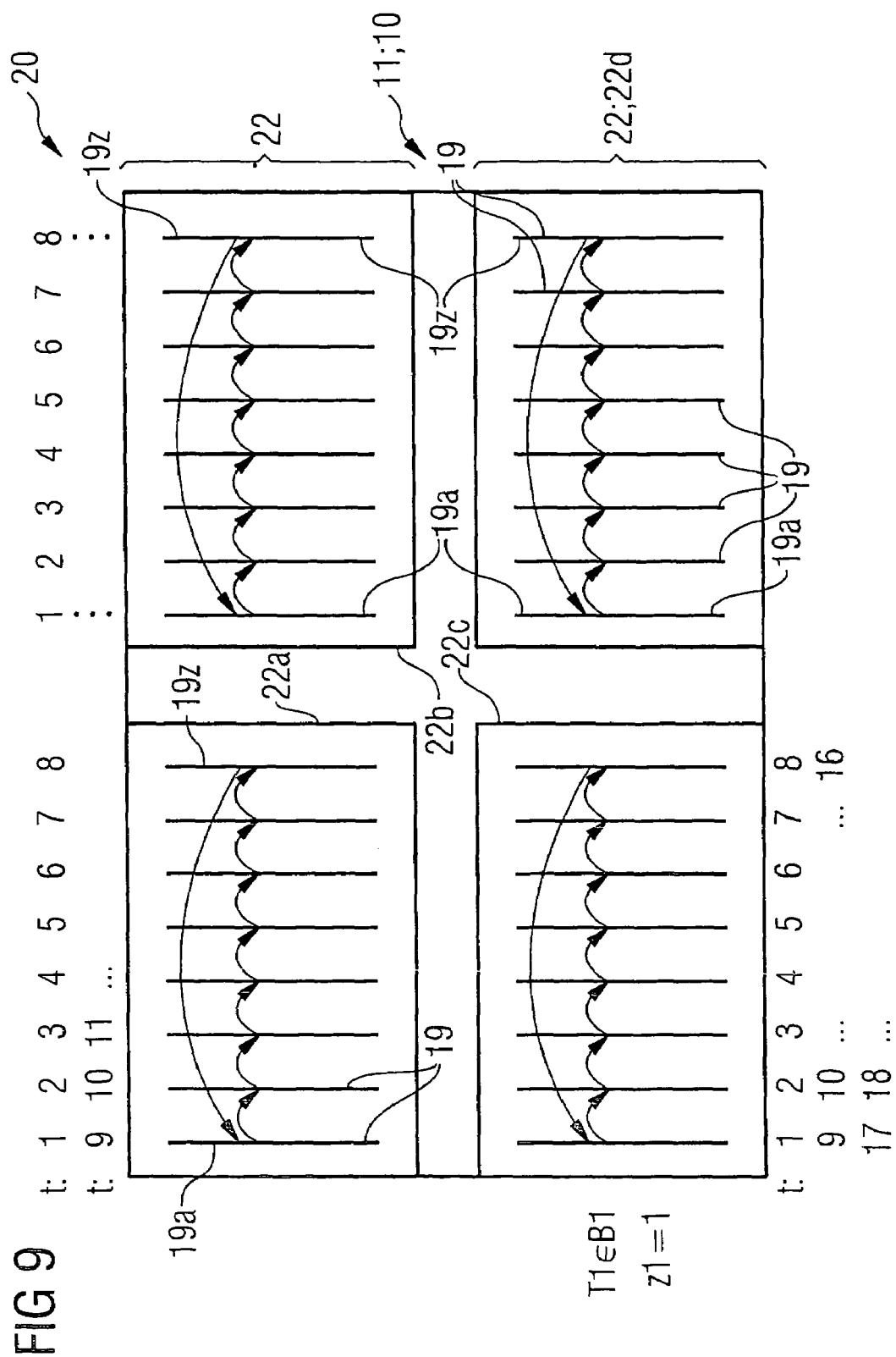
FIGS. 9 to 11 respectively show a diagrammatic illustration of the temporal sequence when refreshing memory cells of the memory apparatus shown in FIG. 8 in the case of an average temperature, an increased temperature and a reduced temperature.
Figure 10:
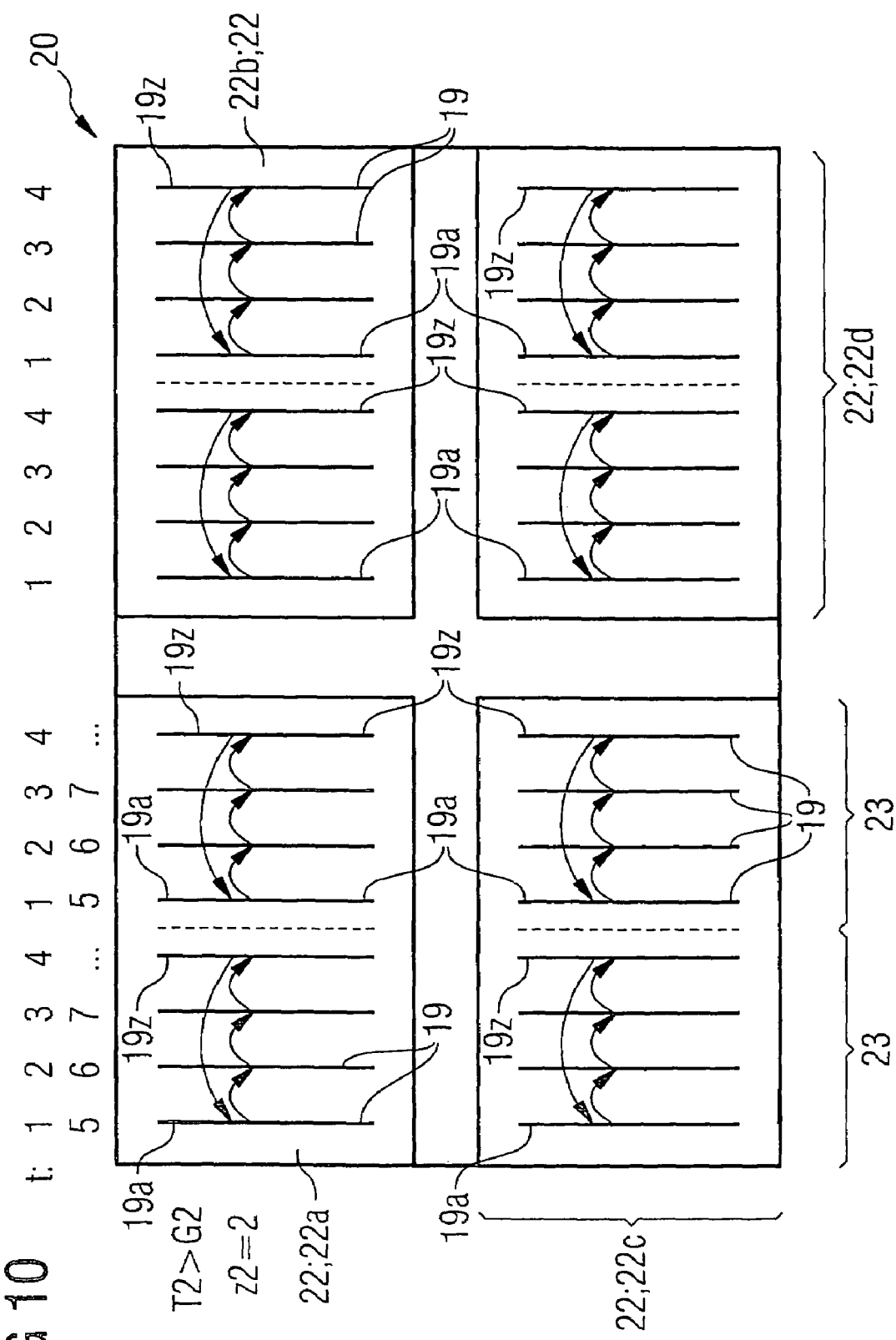
Figure 11:
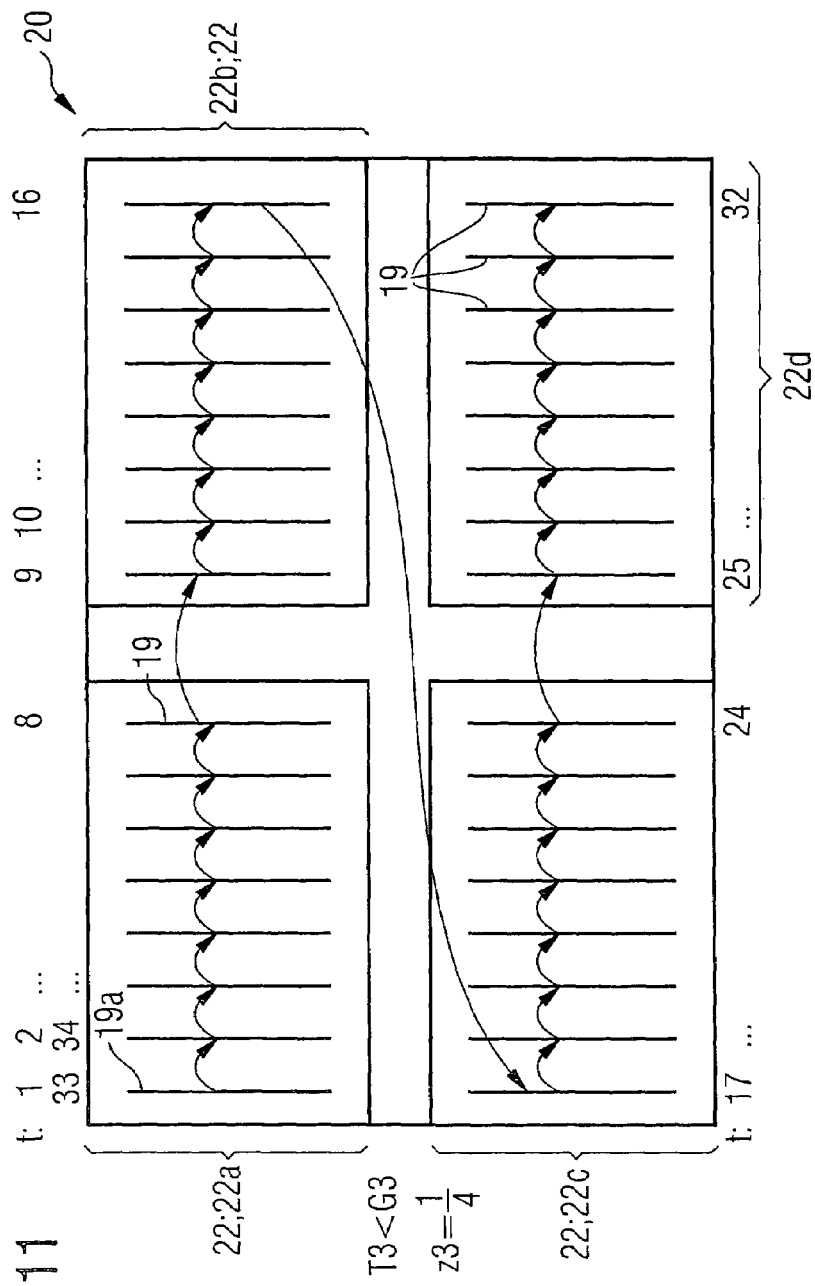

FIGS. 9 to 11 show a diagrammatic illustration of the operation of counting and addressing word lines that are arranged in the integrated memory chips 22 that are arranged on the memory modules 20. In a manner similar to FIG. 3, FIG. 9 shows the temporal sequence of addressing the various word lines at different cycle times, one word line per memory chip 22; 22a, ..., 22d respectively being addressed in the case of a temperature T1 that is within a prescribed bandwidth B1 for the operating temperature, the internal structure of each memory chip 22 being simplified in FIGS. 9 to 11 and, therefore, merely being represented. In particular, the subdivisions of the memory area of each memory chip into memory banks, memory segments, etc., are not illustrated. However, it is important in FIG. 9 that, at a normal operating temperature of between 50 and 70° C., for example, the quantity of word lines that are successively activated in cyclical order are always arranged on the same memory chip 22.

In a manner similar to FIG. 4, addressing cycles that include fewer word lines than all of the word lines of a memory chip 22 are carried out in partial regions of the memory chips 22 as shown in FIG. 10. In the example of FIG. 10, z2=2 word lines are respectively addressed in each pulse t in the case of an increased temperature T2; the refresh time of each memory cell is thus halved.

As shown in FIG. 11, use is made of a cycle that encompasses the memory chips, is intended to address the word lines 19 and in which, on average, 0.25 word lines per memory chip are simultaneously addressed on the entire memory module 20 per pulse of the clock signal.

The quantities for the number of word lines per memory chip, which are specifically selected in FIGS. 9 to 11, are merely exemplary. However, FIGS. 9 to 11 illustrate the inventive method that is used to count word lines in a manner encompassing the memory chips, as is illustrated in FIG. 11 for a reduced temperature T3, or to count in reduced cycles, as is illustrated in FIG. 10 in the case of an increased temperature. As a result, the number of memory cells that are simultaneously refreshed per pulse is optimized on the basis of the respective local temperature.

Figure 12:
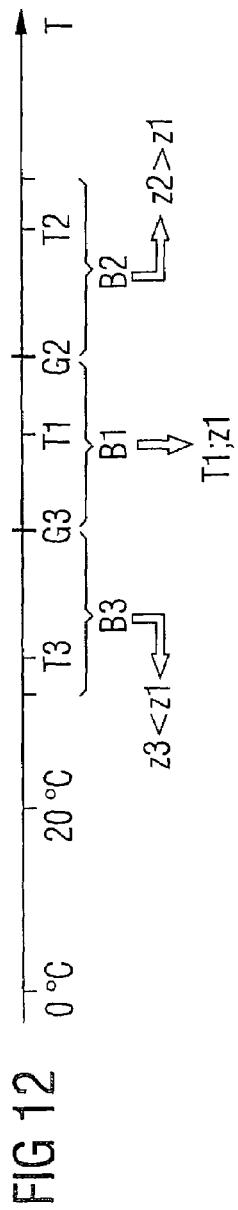
FIG. 12 shows a temperature scale.

FIG. 12 shows a temperature scale which, on the basis of the temperature of an individual memory device, specifies the number z1, z2 or z3 of memory cells that are simultaneously refreshed in a memory device per pulse of the clock signal. If the temperature T1 assumes a desired value within a bandwidth B1 and is thus between an upper limiting value G2 and a lower limiting value G3, the number z1 of memory cells are respectively simultaneously refreshed during each pulse of the clock signal. If, in contrast, the temperature T2 of a memory device is greater than the upper limiting value G2, as is illustrated, for example, in FIG. 1 using the top right memory device 10, this results in the affected memory device 10 determining that a number z2 of memory cells are simultaneously refreshed in it per pulse of the clock signal, the number z2 being greater than the corresponding number z1 at a temperature T1 within the prescribed bandwidth B1. If the temperature is even higher and is outside a further bandwidth B2, provision may be made for even more than z2 memory cells to be respectively simultaneously refreshed per pulse t of the clock signal; for example four times as many as the number z1 and twice as many as the number z2. Conversely, the number of memory cells that are simultaneously refreshed may be reduced to a smaller number z3 in the case of lower temperatures T3 that are less than a lower limiting value G3 for the operating temperature.

The clock rate for the memory signal may be dimensioned, for example, such that a pulse of the clock signal lasts approximately 7.81 µs. This is then the interval of time between refresh operations that are carried out in temporal succession. If refresh operations are carried out using such a signal in a memory chip having four memory banks as illustrated in FIG. 3, this corresponds, for example, to a refresh time of 64 ms for each memory cell. In contrast, if the addressing cycles are reduced as illustrated in FIG. 4, a refresh time of 32 ms results for each memory cell, to be precise without having to reduce the period of the standard clock signal from 7.81 µs to half. When the word line is cyclically addressed in a manner encompassing the memory banks as illustrated in FIG. 5, a clock rate of 7.81 µs may accordingly be used to refresh memory cells with a refresh time of 256 ms. The bandwidths B1, B2, B3 for the individual temperature ranges may be selected differently. The memory banks may contain, for example, 16 memory segments, each of which has 512 word lines. This results in 8192 word lines to which the same number of memory cells are respectively connected. All of the numerical specifications given here are merely exemplary.

What is claimed is:

1. An electronic memory apparatus comprising:
    a plurality of memory devices each having a plurality of nonvolatile memory cells that are refreshed during operation of the electronic memory apparatus;
    a control unit coupled to the plurality of memory devices to pass a same periodic clock signal to each of the memory devices, said clock signal causing the memory cells to be refreshed in the memory devices; and
    a plurality of temperature sensors, each temperature sensor associated with a respective memory device to measure a local temperature near the respective memory device during operation;
    wherein the plurality of memory devices comprises integrated memory chips that each have a plurality of memory banks, wherein the plurality of memory banks comprise memory cells coupled to word lines in each pulse of the periodic clock signal, wherein based on the measured local temperature, and without changing the frequency of the periodic clock signal, each memory device individually determines a refresh time by changing the number of memory cells simultaneously refreshed, and wherein the number of memory cells simultaneously refreshed is changed by changing the number of word lines simultaneously addressed in each pulse of the clock signal.

2. The memory apparatus as claimed in claim 1, wherein the memory devices carry out a refresh operation upon each pulse of the periodic clock signal, wherein the number of memory cells that are refreshed during a pulse of the periodic refresh signal is adjustable on the basis of the temperature of the respective memory device.

3. The memory apparatus as claimed in claim 1, wherein those memory devices whose temperature is outside a prescribed bandwidth for the operating temperature increase or decrease the number of memory cells, which are simultaneously refreshed, by a factor of 2n, n being a natural number.

4. The memory apparatus as claimed in claim 2, wherein, in each memory device the periodic clock signal is always simultaneously forwarded to all the plurality of memory banks.

5. The memory apparatus as claimed in claim 4, wherein, when the temperature measured by a temperature sensor assigned to a memory device is within a prescribed bandwidth for the operating temperature, a respective first number of memory cells is simultaneously refreshed in all of the plurality of memory banks of the respective memory device upon each pulse of the periodic clock signal.

6. The memory apparatus as claimed in claim 5, wherein, when the temperature measured by the temperature sensor assigned to the memory device is above an upper limiting value for the operating temperature, a respective second number of memory cells is simultaneously refreshed in all of the memory banks of the respective memory device upon each pulse of the periodic clock signal, wherein the second number is greater than the first number.

7. The memory apparatus as claimed in claim 6, wherein, when the temperature measured by a temperature sensor assigned to a memory device is below a lower limiting value for the operating temperature, a third number of memory cells is simultaneously refreshed upon each pulse of the periodic clock signal, wherein the third number is less than the first number, and wherein upon each pulse, the quantity of memory cells refreshed is selected, in a manner encompassing the memory banks, from one or more memory banks of the plurality of memory banks.

8. The memory apparatus as claimed in claim 1, wherein the memory devices use the periodic clock signal to count and address word lines, wherein the memory cells coupled to respective addressed word lines are refreshed, wherein upon each pulse of the periodic clock signal word lines other than those in the respective preceding pulse of the clock signal are addressed.

9. The memory apparatus as claimed in claim 8, wherein, when the temperature measured by a temperature sensor assigned to a memory device is within a prescribed bandwidth for the operating temperature, only one word line is addressed in each memory bank upon each pulse of the clock signal, wherein, the word lines of the respective memory bank to be addressed are counted from a first word line to a last word line of the respective memory bank and, wherein, after the last word line of the respective memory bank has been addressed, the first word line of the respective memory bank is addressed again in the next pulse of the clock signal.

10. The memory apparatus as claimed in claim 8, wherein, when the temperature measured by the temperature sensor associated with the memory device is above an upper limiting value for the operating temperature, 2n word lines are respectively addressed in each memory bank upon each pulse of the clock signal, wherein, n is a natural number and the word lines are counted from a first word line to a last word line, in sub-units of the memory banks and, wherein, after the last word line of the respective sub-unit of the memory bank has been addressed, the first word line of the respective sub-unit of the respective memory bank is addressed again upon the next pulse of the clock signal.

11. The memory apparatus as claimed in claim 8, wherein, when the temperature measured by a temperature sensor associated with a memory device is below a lower limiting value for the operating temperature, less than one word line per memory bank is addressed on average, upon each pulse of the clock signal, wherein, the word lines are counted in a manner encompassing the memory banks and, wherein, after a last word line of a memory bank has been addressed, a first word line of another memory bank of the same memory device is addressed in the next pulse of the clock signal.

12. The memory apparatus as claimed in claim 1, wherein each memory bank respectively has a plurality of memory segments, a group of word lines arranged in each memory segment, wherein the memory cells of a respective memory segment are connected to the group of word lines.

13. The memory apparatus as claimed in claim 12, wherein the sub-units of the memory banks are either respective memory segments or respectively comprise a plurality of memory segments.

14. The memory apparatus as claimed in claim 12, wherein the word lines comprise segmented word lines that each have a plurality of word line segments, and wherein each sub-unit of a memory bank respectively comprises precisely one word line segment of each word line of the respective memory bank.

15. The memory apparatus as claimed in claim 1, wherein a first operating mode or a second operating mode of the memory apparatus can be selectively set, wherein the number of memory cells simultaneously refreshed per pulse of the clock signal in the first operating mode is temperature-dependent, and wherein the number of memory cells simultaneously refreshed per pulse of the clock signal in the second operating mode is dependent on the local temperature measured by the temperature sensor assigned to the respective memory device.

16. The memory apparatus as claimed in claim 1, wherein the electronic memory apparatus comprises a memory module.

17. An electronic memory apparatus comprising:
a plurality of memory devices each having a plurality of nonvolatile memory cells that are refreshed during operation of the electronic memory apparatus;
a control unit coupled to the plurality of memory devices to pass a same periodic clock signal to each of the memory devices, the clock signal causing the memory cells to be refreshed in the memory devices; and
a plurality of temperature sensors, each temperature sensor associated with a respective memory device to measure a local temperature near the respective memory device during operation;
wherein the memory devices are memory modules that each have a plurality of integrated memory chips, wherein the memory cells are connected to word lines, wherein based on the measured local temperature, and without changing the frequency of the clock signal, each memory device individually determines a refresh time by changing the number of memory cells simultaneously refreshed, and wherein the number of memory cells simultaneously refreshed is changed by changing the number of word lines simultaneously addressed in each pulse of the clock signal.

18. The memory apparatus as claimed in claim 17, wherein each memory module forwards the clock signal to all of the integrated memory chips of that memory module.

19. The memory apparatus as claimed in claim 17, wherein the memory modules use the periodic clock signal to count and address the word lines of the memory chips of the respective memory module, wherein the memory cells connected to addressed word lines respectively are refreshed, and wherein, word lines other than those in the respective preceding pulse of the clock signal are addressed in each pulse of the clock signal.

20. The memory apparatus as claimed in claim 17, wherein, when the temperature measured by a temperature sensor associated with a respective memory module is within a prescribed bandwidth for an operating temperature, precisely one word line is addressed in all of the memory chips of the respective memory module upon each pulse of the clock signal, wherein, the word lines of the respective memory chips are counted from a first word line to a last word line of the respective memory chip, wherein, after the last word line of the respective memory chip has been addressed, the first word line of the respective memory chip is addressed again in the next pulse of the clock signal.

21. The memory apparatus as claimed in claim 17, wherein, when the temperature measured by a temperature sensor associated with a respective memory module is above an upper limiting value for the operating temperature, 2n word lines are respectively addressed in each memory chip of the respective memory module upon each pulse of the clock signal, wherein, n is a natural number, and wherein the word lines are counted from a first word line to a last word line in partial regions of the memory chips, and wherein, after the last word line of the respective partial region of the memory chip has been addressed, the first word line of the respective partial region of the memory chip is addressed again in the next pulse of the clock signal.

22. The memory apparatus as claimed in claim 17, wherein, when the temperature measured by a temperature sensor associated with a respective memory module is below a lower limiting value for the operating temperature, less than one word line per memory chip is addressed on average, in each pulse of the clock signal, wherein the word lines are counted in a manner encompassing the memory chips, and wherein, after a last word line of a memory chip has been addressed, a first word line of another memory chip of the respective memory module is addressed in the next pulse of the clock signal.

23. An electronic memory apparatus comprising:
- memory devices, wherein each memory device comprises memory cells, wherein the memory cells are refreshed during operation of the electronic memory apparatus;
- a control unit coupled to the memory devices to pass a same periodic clock signal to each of the memory devices, the clock signal refreshing the memory cells in the memory devices; and
- temperature sensors, wherein each memory device comprises a temperature sensor to measure a local temperature during operation;
- wherein each memory device individually determines a refresh time by changing the number of memory cells simultaneously refreshed based on the local temperature in the memory device and without changing the frequency of the clock signal, wherein, if the local temperature exceeds an upper limiting temperature the number of memory cells simultaneously refreshed is increased by increasing the number of word lines simultaneously addressed in each pulse of the clock signal.

24. The memory apparatus of claim 23, wherein, if the local temperature is less than a lower limiting temperature, the number of memory cells simultaneously refreshed is decreased by decreasing the number of word lines simultaneously addressed in each pulse of the clock signal.

* * * * *